United States Patent
Matioli et al.

(10) Patent No.: US 12,255,037 B2
(45) Date of Patent: Mar. 18, 2025

(54) NANOPLASMA SWITCH DEVICE FOR ULTRAFAST SWITCHING

(71) Applicant: ECOLE POLYTECHNIQUE FEDERALE DE LAUSANNE (EPFL), Lausanne (CH)

(72) Inventors: Elison De Nazareth Matioli, Lausanne (CH); Mohammad Samizadeh Nikooytabalvandani, Lausanne (CH)

(73) Assignee: Ecole Polytechnique Federale De Lausanne, Lausanne (CH)

( * ) Notice: Subject to any disclaimer, the term of this patent is extended or adjusted under 35 U.S.C. 154(b) by 69 days.

(21) Appl. No.: 17/798,462

(22) PCT Filed: Mar. 12, 2021

(86) PCT No.: PCT/EP2021/056316
§ 371 (c)(1),
(2) Date: Aug. 9, 2022

(87) PCT Pub. No.: WO2021/190955
PCT Pub. Date: Sep. 30, 2021

(65) Prior Publication Data
US 2023/0360875 A1    Nov. 9, 2023

(30) Foreign Application Priority Data
Mar. 23, 2020   (WO) ............. PCT/EP2020/058026

(51) Int. Cl.
  H01J 17/02   (2006.01)
  H01J 17/06   (2006.01)
  H01T 4/10    (2006.01)

(52) U.S. Cl.
  CPC ............ *H01J 17/06* (2013.01); *H01T 4/10* (2013.01)

(58) Field of Classification Search
  CPC .. H01J 17/00; H01J 17/02; H01J 17/04; H01J 17/06; H01J 17/10; H01J 37/3222; H01J 37/32247; H01J 37/32321; H01J 37/32339; H01T 4/08; H01T 4/10; H03K 17/88
  See application file for complete search history.

(56) References Cited

U.S. PATENT DOCUMENTS

| | | | | |
|---|---|---|---|---|
| 7,173,295 B1 * | 2/2007 | Mar | ............. | H01L 31/125 257/466 |
| 7,705,415 B1 * | 4/2010 | Nabet | ............. | H01L 31/1035 257/443 |
| 2003/0080664 A1 * | 5/2003 | Eden | ............. | H01J 17/40 313/631 |

(Continued)

OTHER PUBLICATIONS

Samizadeh Nikoo, Mohammad, et al. "Nanoplasma-enabled picosecond switches for ultrafast electronics." Nature 579.7800 (2020): 534-539 (p. 1-15). (Year: 2020).*

(Continued)

*Primary Examiner* — Thai Pham
(74) *Attorney, Agent, or Firm* — Blueshift IP; Robert Plotkin

(57) ABSTRACT

The invention relates to a nanoplasma switch device, comprising: —multiple electrically isolated electrodes; —a gap separating the two electrodes; wherein the gap has a width which is dimensioned to effect the generation of a plasma by electric-field electron emission.

14 Claims, 7 Drawing Sheets

(56) References Cited

U.S. PATENT DOCUMENTS

2006/0082319 A1* 4/2006 Eden ............... H01J 1/025
                                                    315/169.3
2011/0037102 A1* 2/2011 Tchertchian ........ H01L 29/0821
                                                    257/E29.328

OTHER PUBLICATIONS

Mohammad Samizadeh Nikoo et al., "Nanoplasma-enabled picosecond switches for ultrafast electronics," Nature, Macmillan Journals Ltd., Etc, London, vol. 579, No. 7800, Mar. 1, 2020, pp. 534-539, XP037080552, ISSN: 0028-0836, DOI: 10.1038/S41586-020-2118-Y.

International Search Report & Written Opinion mailed Jun. 10, 2021, in international patent application No. PCT/EP2021/056316, 8 pages.

* cited by examiner

NANOPLASMA SWITCH DEVICE FOR ULTRAFAST SWITCHING

TECHNICAL FIELD

The present invention relates to nanoplasma switch devices for ultrafast switching in the picosecond regime.

TECHNICAL BACKGROUND

High-speed electronic circuits in different areas such as terahertz or ultra-wide-band (UWB) systems need ultra-fast switches. Nanometer-scale transistors based on III-V compound semiconductors, such as GaAs, InAs and InP, are traditionally used for many high-speed and high-frequency electronic systems. Due to their high electron mobilities, these devices exhibit very high small-signal cut-off frequencies in the Terahertz range.

However, in multiple applications, the high frequency large-signal performance of such transistors is severely affected by their output capacitances ($C_{out}$), by their limited electron saturation velocities and critical electric fields. For a semiconductor transistor device, usually the switching speed is basically limited to 1 V/ps, even for semiconductor materials with a high electron mobility.

On the other hand, plasma devices, such as gas discharge tubes, have nearly ideal ON state providing extremely high current densities and do not exhibit the $C_{out}$-limited switching speed. The dynamic performance of those plasma devices, however, is severely restricted by their relatively low electric field and the considerable electron scattering between their two electrodes, which result in nanosecond range switching times.

It is an object of the present invention to provide an ultra-fast switching device that overcomes the limitation of traditional solid-state and plasma switches, particularly which is suitable for integrated circuit implementation.

SUMMARY OF THE INVENTION

This object has been achieved by the nanoplasma switch device according to claim 1 and by the circuitry comprising such a nanoplasma switch device according to the independent claim.

Further embodiments are indicated in the depending subclaims.

According to a first aspect, a nanoplasma switch device is provided, comprising:
multiple electrically isolated electrodes;
a gap separating the two electrodes;
wherein the gap has a width which is dimensioned to effect the generation of a plasma by electric-field electron emission or tunneling.

One idea of the above nanoplasma switch device is to provide a gap between two conductive electrodes which allows the formation of a nanoplasma. In difference to large-scale plasma switches, the switching speed can be substantially increased, as the plasma formation for such a nano-gap is dominated by electric field electron emission (sometimes also named field effect emission) in contrast to Townsend Avalanche effect.

Electric-field electron emission is emission of electrons induced by an electrostatic field. Field electron emission can take place from solid or liquid surfaces, into vacuum, air, a fluid, or any non-conducting or weakly conducting dielectric. In the field of plasma formation by electric field electron emission, the threshold voltage of the nanoplasma switch device, which corresponds to the breakthrough threshold, has a decreased dependency on the gap size (width) so that with decreasing gap sizes the electric field at threshold voltage is substantially increased compared to large-scale plasma devices. This results in extremely fast discharging responses, once the threshold voltage is exceeded. Preferably, the gap size for plasma formation by electric field electron emission is between 5 nm and 5 µm for air (under atmospheric pressure) as a dielectric medium. In a range between 3 Angstrom and 5 nm the plasma formation may be increasingly dominated by tunneling. This effect can also be used for fast switching by inserting thin 2D material layers below 5 nm in between the metal contacts.

Furthermore, the electrodes may be formed of metal or doped semiconductor on a nonconductive substrate.

It may be provided that the gap is filled with air, particularly under atmospheric pressure.

Alternatively, the gap may be filled with a gas different from air.

Moreover, the device may be operated at a given pressure other than atmospheric pressure.

According to an alternative embodiment, the gap may have a width of below 5 nm to reduce the device turn on voltage, for which the fast switching might happen through tunneling. In this case, one or a combination of 2D materials, such as WSe, MoS2, and/or BN can be introduced between the electrodes. A 2D material, as used herein, is a material configured as one or a few layers or sheets having a thickness in the order of a single or a few molecules. The introduction of the sandwiched 2D-material enables to have a very thin separation between the electrodes for fast tunneling at very low biases.

Moreover, the gap width may be configured to have an electrical field at breakthrough of a voltage below to between 10V and 1000V.

Additionally, an optical device may be provided which is configured to trigger a discharge by an optical signal to control the switch device, by shining photons to one of the electrodes. This allows to stimulate electron emission or direct ionization by high energy photons directed onto one of the electrodes, offering control or modulation capability to the device.

According to a further aspect, the nanoplasma switch device is coupled with an energy storing device, such as a capacitor, inductor, transmission line and the like so that the energy stored in the energy storing device is suddenly discharged when the threshold voltage of the nanoplasma switch device is exceeded. This results in ultra-wide-band (UWB) pulse generation with very high amplitude and low pulse width.

A delay structure may be included which is arranged between the excitation port and the nanogap so that the input capacity is refrained from discharging through the nano-gap immediately after switching. This again results in ultra-wide-band (UWB) pulse generation with very high amplitude and low pulse width.

According to a further aspect a circuitry for generating an oscillation is provided comprising the above nanoplasma switch device, a resonator, e.g. an LC tank, coupled with the nanoplasma switch device, and an energy source for energizing the resonator.

So, a circuitry for the generation of ultra-high-speed oscillation signals in the Terahertz range may be provided. Such a circuitry applies a resonator which is smoothly charged. When the output voltage of the resonator reaches the threshold voltage of the nanoplasma switch device, it turns to the ON state followed by discharging the energy stored in the resonator, thereby emitting a high-frequency wave packet into the load, particularly when connected to an antenna. The picosecond switching of the nanoplasma-switch device enables exciting very high resonance frequencies in the Terahertz range, and the high amplitude operation with the nanoplasma switch device enables a large energy stored in the resonator leading to high output powers. In general, the resonance frequency is determined by the resonator design.

According to a further aspect, a circuitry for pulse-sharpening is provided comprising the above nanoplasma switch device and a signal driver circuit the output of which is connected with the nanoplasma switch device. So, a circuitry can be provided which allows to sharpen an edge of a pulse with a very high repetition rate using the above nanoplasma switch device. The pulse-sharpening circuit uses a driver circuit to apply a control voltage over the threshold voltage so that once the driver circuit drives a driver output voltage above the threshold voltage, an output pulse with a high rising slope is generated. The nanoplasma switch device remains in the ON-state (conductive state) until the driver circuit stops supplying the signal. When the driver output voltage input signal goes down to zero, the OFF-state of the nanoplasma switch device is ultrafast recovered.

According to a further aspect, a circuitry for protecting an integrated circuit or a discrete device against overvoltage is provided, comprising a terminal of the integrated circuit or the discrete device, and the above nanoplasma switch device connected with the terminal.

Moreover, the nanoplasma switch device may be in series with a resistance and/or inductance.

BRIEF DESCRIPTION OF THE DRAWINGS

Embodiments are described in more detail in conjunction with the accompanying drawings, in which.

DESCRIPTION OF EMBODIMENTS

Figure 1A:
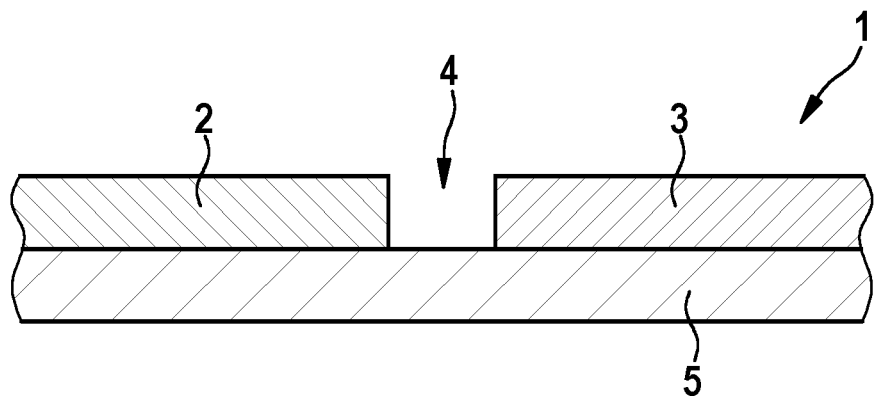
FIGS. 1a and 1b show a cross-sectional view through a nanoplasma switch device and a top view onto the nanoplasma switch device according to the present invention, respectively.
Figure 1B:
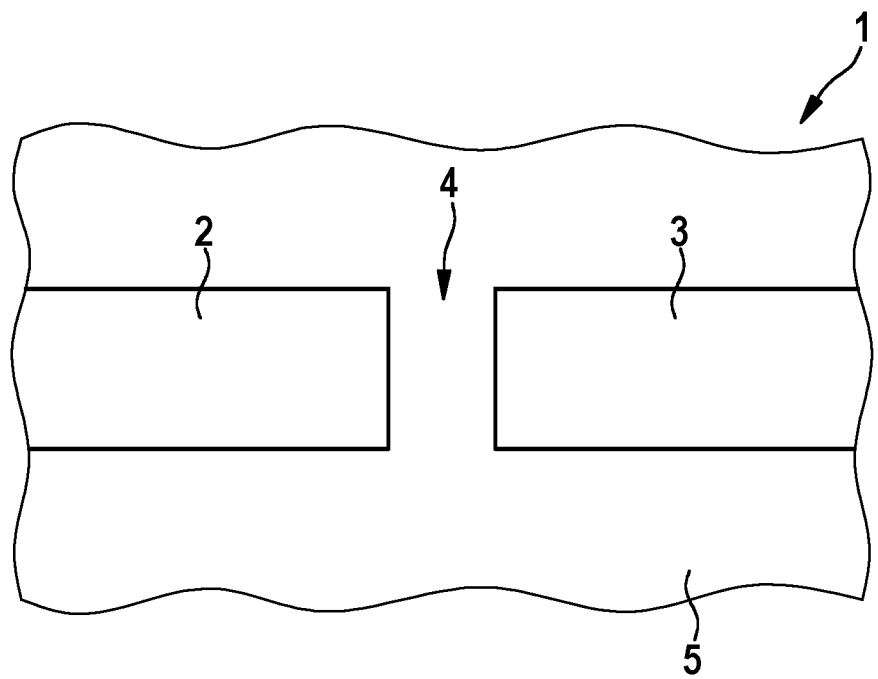

FIG. 1a shows a cross-sectional view through an integrated nanoplasma switch device 1. FIG. 1b shows a top view onto the integrated nanoplasma switch device 1. The nanoplasma switch device 1 comprises a first electrode 2 and a second electrode 3 separated by a nanometer or micrometer scale gap 4, herein called nano-gap.

The electrodes may be made of a conductive material, such as of metal or doped semiconductor, which may be fabricated based on a planar fabrication process on a substrate 5. The gap size (width) of the nano-gap 4 is in the nanometer or micrometer range to allow the formation of a nanoplasma in operation the formation of which is dominated by the effect of electric-field electron emission.

Figure 2A:
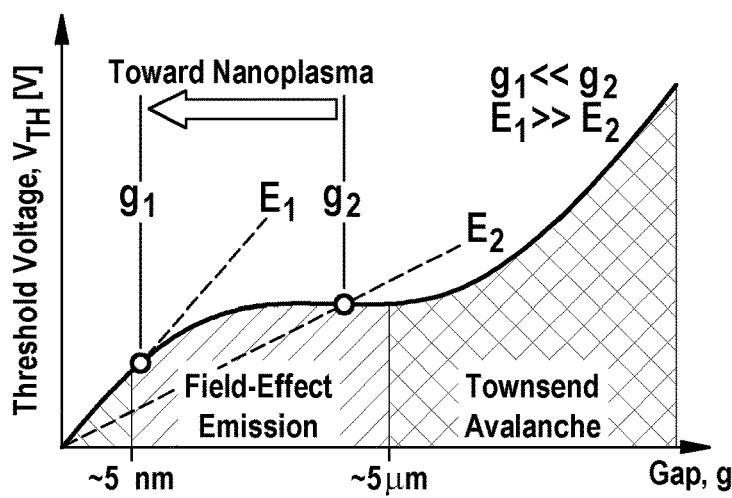
FIGS. 2a to 2c show a diagram for illustrating the characteristics between the threshold voltage and the gap size, a diagram showing the electrical field over the gap size of a nanoplasma switch device, and a diagram illustrating the time characteristics of the gap resistance during a discharge event for a nanoplasma channel and a large plasma channel.

As shown in FIG. 2a, the diagram illustrates the characteristics of the threshold voltage $V_{th}$, of a nanoplasma switch device over varying gap sizes. The threshold voltage $V_{th}$, defines the breakthrough voltage at which the plasma development and the turning into the conductive state starts. Over the gap size, a plasma at voltages over the threshold voltage is formed by physical effects, such as tunneling at gap sizes smaller than 5 nm, by electric-field electron emission for gap sizes between 5 nm and 5 µm and by a Townsend avalanche effect for gap sizes larger than 5 µm.

Figure 2B:
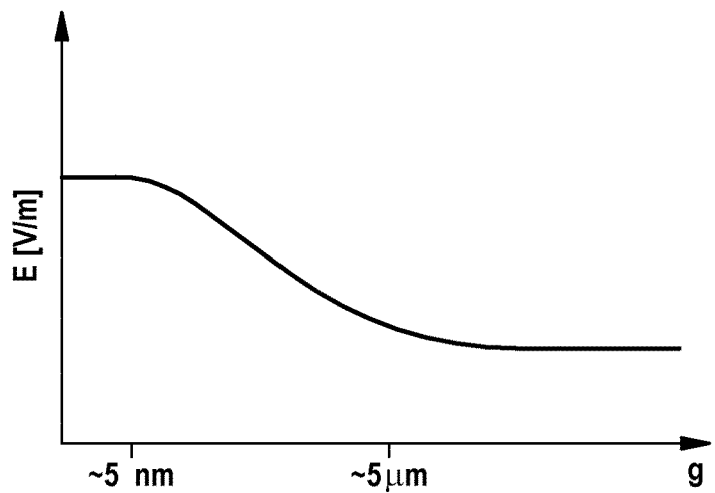

The corresponding electrical field E is depicted in FIG. 2b. It can be seen that due to the electric-field electron emission that maintains a close to constant threshold voltage over varying gap sizes, the value of the achievable electrical field strength is increased towards smaller gap sizes.

Basically, the time for the formation of the plasma which determines the decrease of the resistivity during the transition to the ON state, over a gap strongly depends on the electrical field at the breakthrough. In other words, a higher electrical field results in a faster formation of the plasma, so that for high switching speeds a gap size can be preferably chosen in the range of 5 nm to 5 µm, preferably between 10 nm to 1 µm.

As the electrical field at breakthrough is higher in a gap size region where the plasma formation is dominated by the electric-field electron emission rather than by the Townsend avalanche effect, nanoplasma switch devices with gap sizes of about 5 nm to 5 µm tend to have a significant faster transition to the ON state than switch devices with higher gap sizes.

Figure 2C:
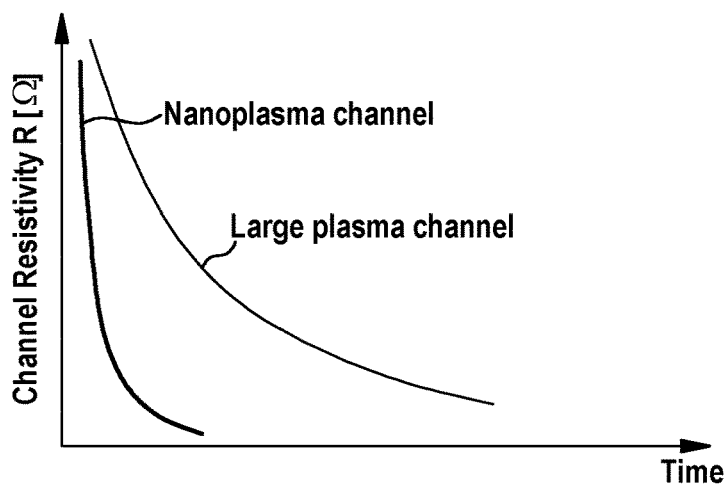

In FIG. 2c, it can be seen the time characteristics of the decrease of resistivity beginning with the start of plasma formation for a nanoplasma channel and a large plasma channel, respectively.

Basically, for a nanoplasma device 1 as shown in FIGS. 1a and 1b an increased electric field, very high switching speeds can be achieved. The switching of the nanoplasma switch device of FIGS. 1a, 1b from a non-conductive (OFF-state) to an conductive state (On-state) is initiated by applying a voltage over a threshold voltage. Due to the increased electric field, the nanoplasma switch device turns to a conductive state very quickly so that switching times in the picosecond range can be achieved.

Figure 3:
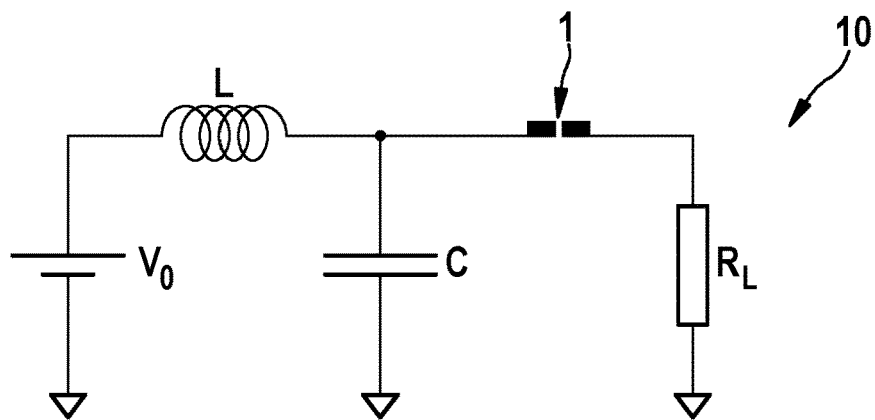
FIG. 3 shows a circuitry for generating an ultrafast impulse signals.

FIG. 3 shows a circuitry 10 to enable the nanoplasma switch device to generate ultrafast impulse signals. The circuitry 10 comprises a capacitor C which is charged through the voltage source $V_0$ in series with an inductor L up to the threshold voltage $V_{th}$ of the nanoplasma switch device 1. The energy stored in the capacitor C is discharged into a load $R_L$ once the nanoplasma switch device 1 turns conductive by formation of a plasma breakthrough. The time-constant $\sqrt{LC}$ is higher than the output time constant $R_L C$ so that at a switching event the capacitor C is discharged to the load $R_L$ without the previous stage being involved resulting in the generation of an impulse.

Figure 4:
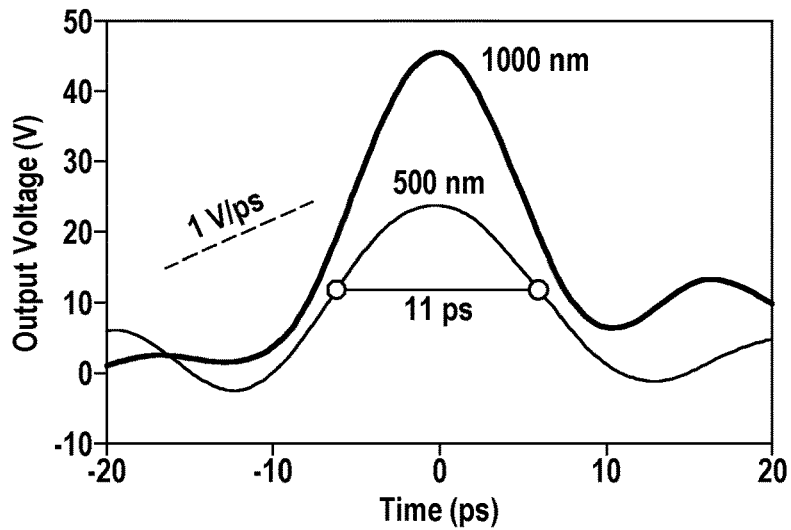
FIG. 4 shows near-ideal impulse signals generated using nanoplasma devices with gap sizes 500-nm and 1000-nm.

FIG. 4 shows near-ideal impulse signals generated by nanoplasma devices with two different gap sizes 500-nm and 1000-nm. The switching time and the voltage and current capability of the nanoplasma switch device determines the minimum rise time and pulse width as well as the maximum peak power of the generated signals.

Figure 5:
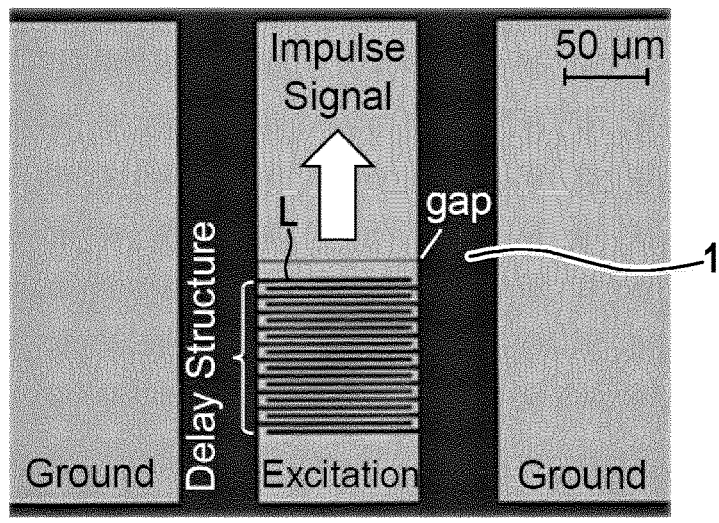
FIG. 5 shows a monolithically integrated circuit for impulse generation, corresponding to the waveforms shown in FIG. 4.

In FIG. 5, a monolithically integrated circuit is shown, showing the impulse generation circuitry in an integrated implementation. The delay structure between the excitation port and the nano-gap of the nanoplasma switch device 1 does not let the input transmission line discharge through the gap immediately after switching.

Figure 6:
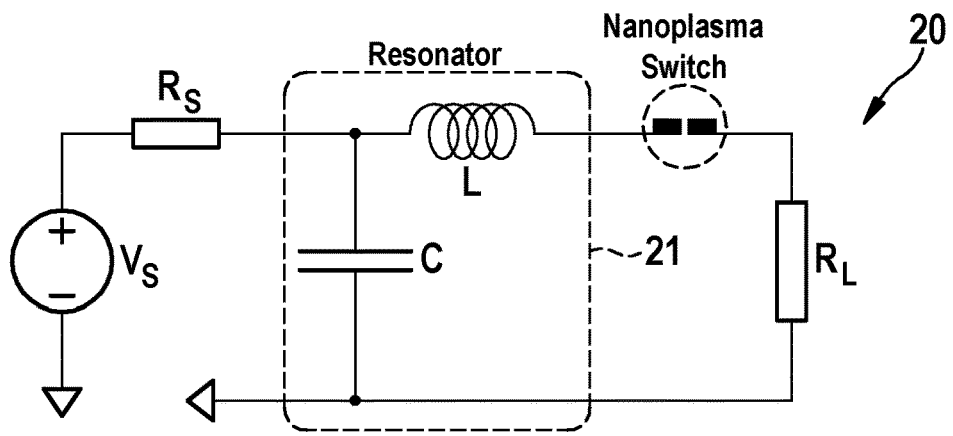
FIG. 6 shows a circuitry for generating an ultra-high frequency oscillation signal at high-peak power levels using a nanoplasma switch device of FIG. 1.
Figure 7:
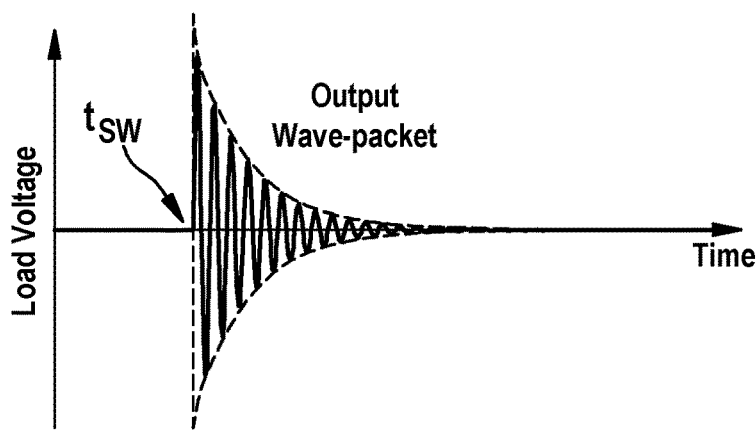
FIG. 7 shows the characteristics of discharging the energy stored in the resonator as a high-frequency wave packet.

FIG. 6 shows a circuitry 20 for the generation of ultra-high frequency oscillation signals at high-peak power levels. As shown in FIG. 6, a resonator 11 is coupled with a voltage source $V_S$ over a resistance $R_S$. The output of the resonator 11 is connected with the nanoplasma switch device 1 to a load $R_L$. When the output voltage of the resonator 11 exceeds the threshold voltage $V_{TH}$ of the nanoplasma switch device, it turns conductive discharging the energy stored in the resonator as a high-frequency wave packet, as shown in FIG. 7, into the load $R_L$. The performance of such a pulse source is determined by the employed nanoplasma switch device as well as the resonator configuration.

Picosecond switching of the nanoplasma switch device 1 enables exciting very high resonance frequencies in the Terahertz range and the high amplitude operation of the nanoplasma switch device result in high energy level stored in the resonator leading to high output powers. The resonator design determines the resonance frequency as well as the pulse energy of the oscillation at the output of the circuitry 20.

Figure 8:
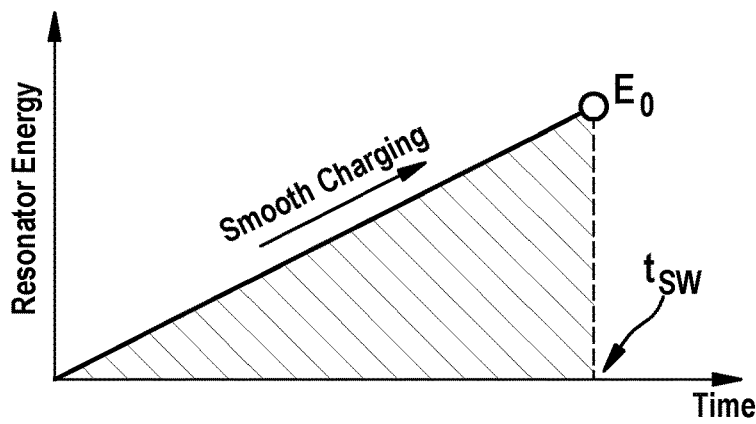
FIG. 8 shows a diagram of the time characteristics of the resonator energy of the circuit of FIG. 6 in operation.

FIG. 8 shows the resonator energy over time characteristics before starting the oscillation. It can be seen that the resonator energy is smoothly rising until the threshold voltage is achieved to release the energy in an ultrafast pulse of an output wave package.

Figure 9:
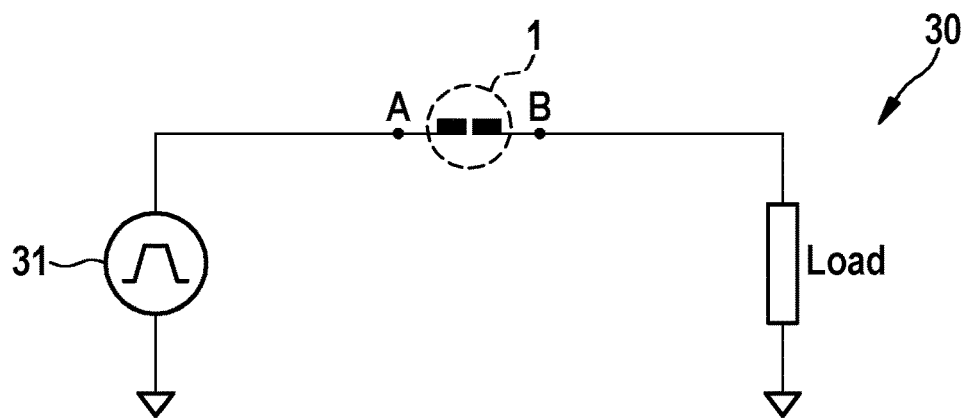
FIG. 9 shows a pulse-sharpening circuitry using a nanoplasma switch device according to the invention.
Figure 10:
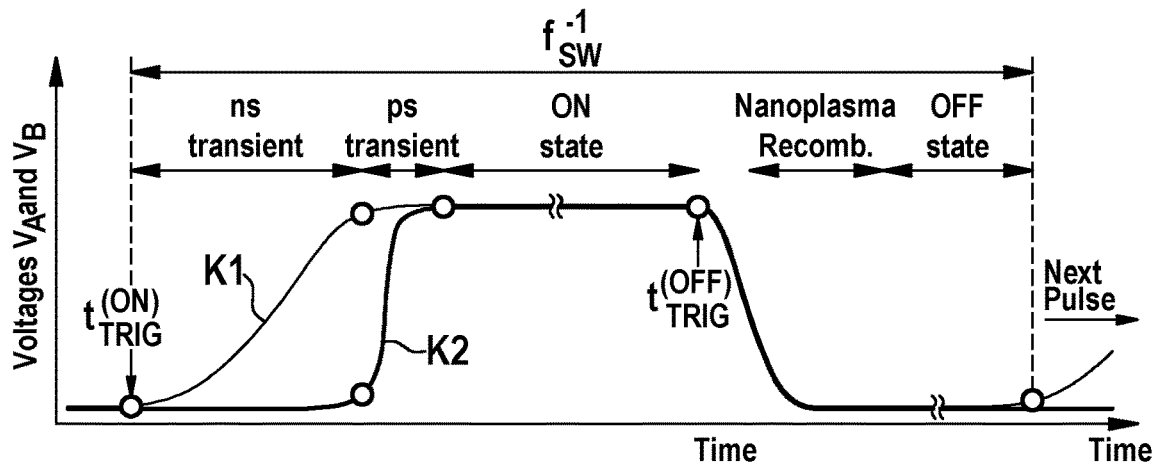
FIG. 10 shows a signal-time-diagram of the output pulse of the pulse-sharpening circuit of FIG. 9.

FIG. 9 shows a circuitry 30 for sharpening square pulses with a high repetition rate using the nanoplasma switch device 1. The pulse-sharpening circuitry 30 uses a signal driver circuit 31 for generating a pulse, the output of which is coupled with the nanoplasma switch device 1. As shown in the signal time diagram of FIG. 10, it can be seen the characteristics of the output voltage of the signal driver circuit 31 which is connected with one electrode 2 of the nanoplasma switch device 1 and the voltage at the second electrode 3 of the nanoplasma switch device 1. It is shown how the output signal (K2) of the nanoplasma switch device 1 follows the output voltage (K1) of the signal driver circuit 31. The nanoplasma switch device 1 turns on just after the signal driver circuit output signal (K1) reaches the threshold voltage $V_{th}$ of the nanoplasma switch device 1 resulting in a pulse-sharpening which converts the input nanosecond rise time of the signal driver circuit output signal (K1) to picosecond transition of the output voltage (K2) of the nanoplasma switch device 1.

The nanoplasma switch device 1 remains in the ON-state until the signal driver circuit 31 switches off (falling edge of the driver circuit output signal (K1)). When the signal driver circuit output signal (K1) becomes zero, the ultrafast recombination of the ionized molecules in the nanoplasma of the nanoplasma switch device 1 recovers the OFF-state of the nanoplasma switch device 1.

Figure 11:
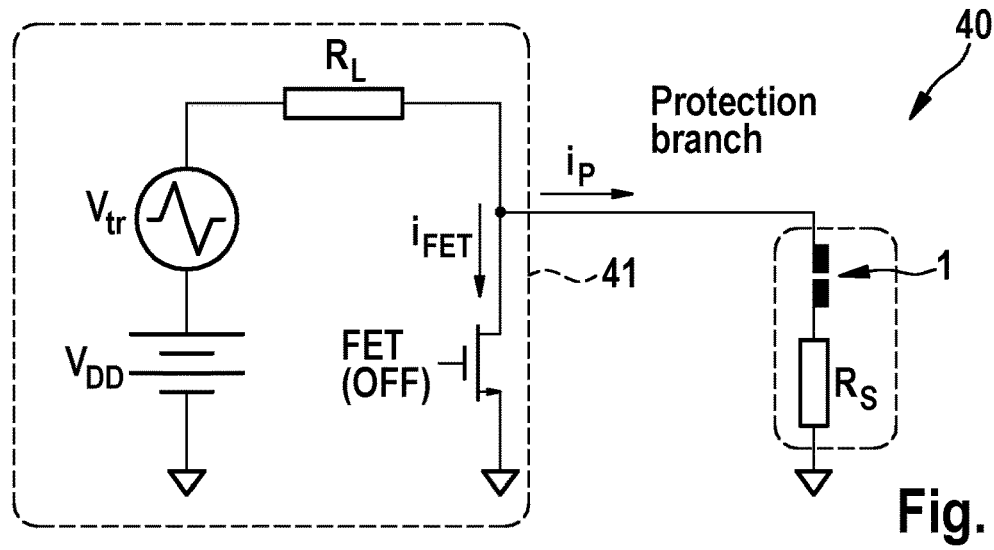
FIG. 11 shows a circuitry for protecting an output driver against overvoltage.

FIG. 11 shows circuitry 40 for overvoltage protection. The overvoltage protection circuitry 40 includes an output driver 41, the output of the output driver 41 is used to drive a signal, particularly to an external terminal of an integrated circuit or a discrete device to be protected. Further the output of the output driver 41 is coupled with an overvoltage protection which includes a series of the nanoplasma switch device 1 and a series resistance $R_S$. The series resistance $R_S$ can be used for smoothing the discharge process.

The nanoplasma switch device 1 may serve as a protection of the output against an overvoltage as the breakthrough at the threshold voltage limits the voltage at the output, thereby protecting the components of the output driver 41. The nanoplasma switch device 1 is configured to have a threshold voltage which is substantially below a damaging voltage.

When the voltage over device is lower than the protection limit $V_{TH}$, the nanoplasma switch device 1 is in OFF-state, resulting in ultra-low parasitics. When the voltage over device turns to be higher than the protection limit $V_{TH}$, the nanoplasma switch device 1 discharges the extra energy and quickly switches into the ON-state, resulting in low resistivity to lower the applied voltage and protecting the device from overvoltage and damage. As a result, the protection branch current $i_P$ is completely negligible with respect to the FET current; therefore, the protection branch does not affect the normal operation of the device.

In difference to a large plasma switch device, the faster switching time basically improves the protection of the output driver substantially. Thereby, a safe protection against overvoltage caused by electromagnetic fields, by power RF radiations and the like can be obtained. The nanoplasma switch device 1 can be easily integrated in input and output ports of an integrated circuit, providing a fast action, a high current capability as well as a low parasitic capacitance. The ability of fast switching and retaining the OFF-state in a short time makes the nanoplasma switch device 1 well matched for such an application. In case of even higher voltages, they can protect the electronic device from overvoltage which may cause a hard breakdown and/or device failure. The voltage protection limit can be easily adjusted by configuring the gap size of the nanoplasma switch device 1.

Figure 12A:
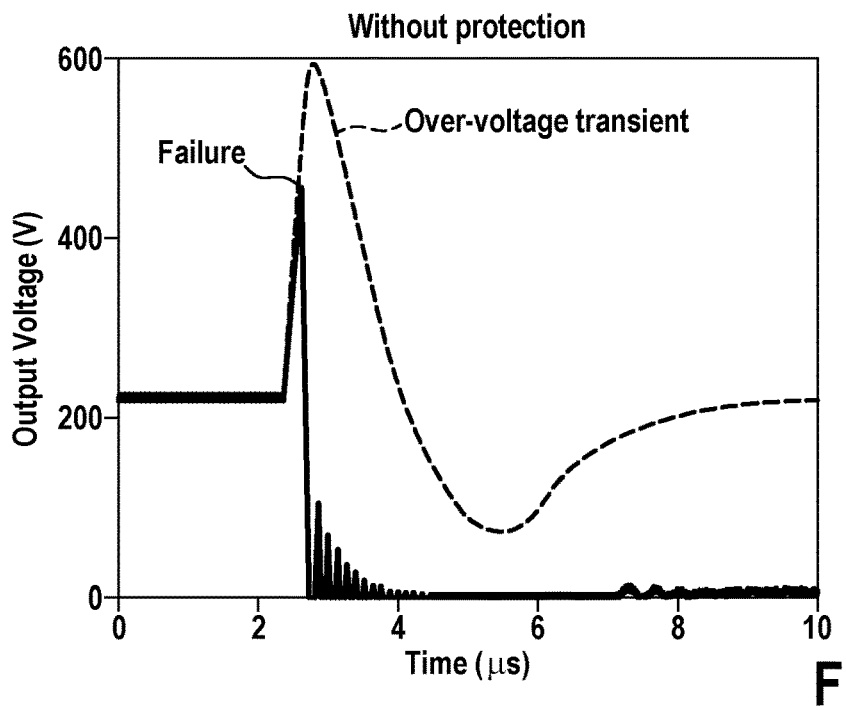
FIGS. 12a to 12b show time characteristics of the output voltage without and with the nanoplasma switch device as an overvoltage protection.
Figure 12B:
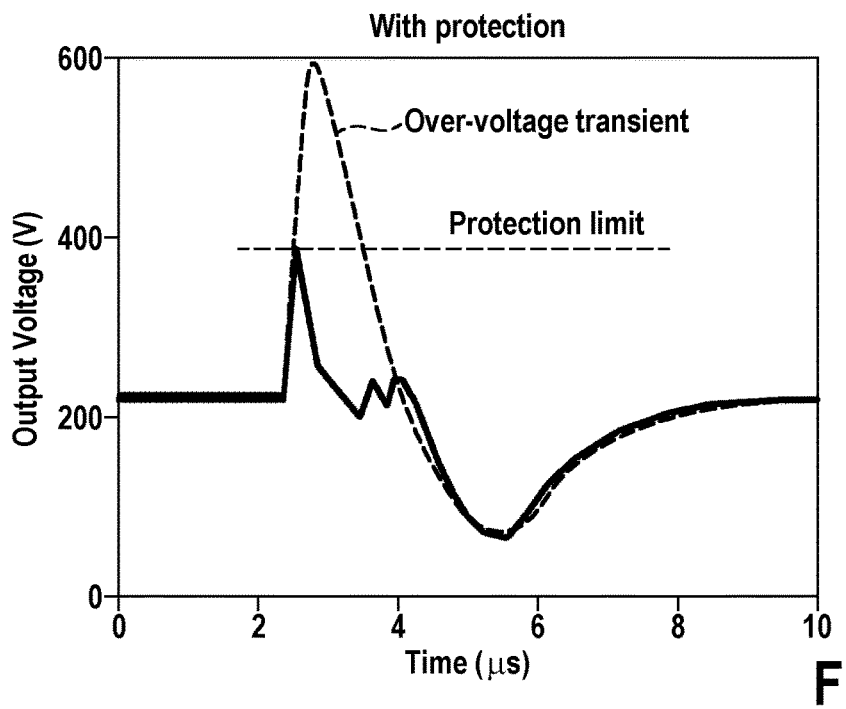

FIGS. 12a and 12b show the time characteristics of the voltage at the output without protection by the nanoplasma switch device 1 and a protection by the nanoplasma switch device 1, respectively. When the voltage over the nanoplasma switch device is lower than the protection limit given by the threshold voltage, the nanoplasma switch device is non-conductive resulting in the very low parasitic capacitance. As a result, the protection current is completely negligible with respect to the current in the output driver. When the drain-source voltage of the output driver becomes larger than the threshold voltage, the nanoplasma switch device discharges the extra energy protecting the output driver from an overvoltage.

Figure 13:
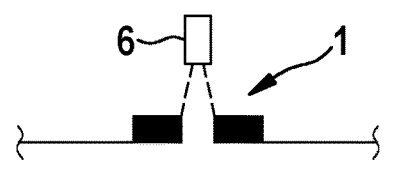
FIG. 13 shows an alternative embodiment of a nanoplasma switch device including an optical device to trigger a discharging.

According to a further embodiment, which is shown in FIG. 13, an optical device 6, such as a laser diode, an LED or the like, may be provided which is configured to trigger a discharge by an optical signal to control the switch device 1, by shining high energy photons to one of the electrodes. This allows to stimulate electron emission or direct ionization by high energy photons directed onto one of the electrodes. This may give control or modulation capability to the device.

Figure 14A:
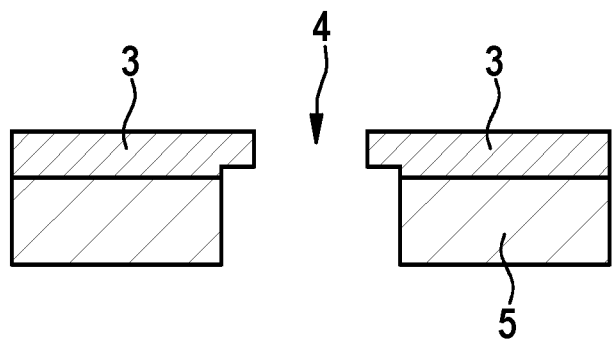
FIG. 14 shows a nanoplasma switch device, in which the substrate is removed.
Figure 14B:
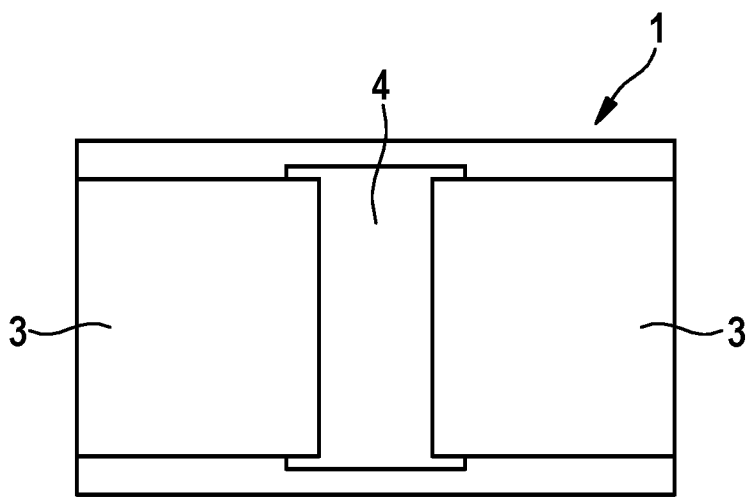

FIGS. 14a and 14b show the side view and a top view of a nanoplasma switch device in which the substrate below the gap is removed. This eliminates a potential influence of the properties of the substrate material on the device behavior.

Figure 15:
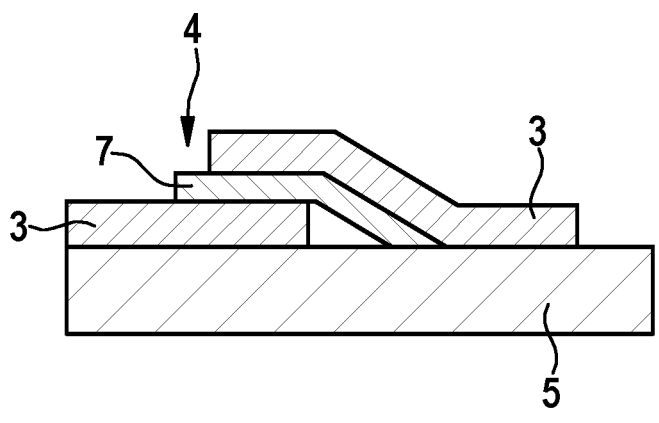
FIG. 15 shows an alternative embodiment of the nanoplasma switch device including one or more 2D material layers in between the electrodes.

FIG. 15 shows an alternative embodiment of the nanoplasma switch device including one or more 2D material layers 7 in between the electrodes 3. This embodiment exemplarily shows a structure of a nanoplasma switch device, in which a 2D material (monolayer or several layers) such as MoS2, WSe2, BN, etc., is sandwiched vertically between two metal plates. The 2D material layer 7 can be deposited by conventional processes while a predefined thickness can be obtained to define the characteristics of the nanoplasma switch device. Further the 2D material layer 7 maintains a short distance between two electrodes 3, so that the nanoplasma switch device 1 works in the tunneling regime.

In summary, an integrated nanoplasma switch device concept is described that enables picosecond switching of high amplitude signals. The nanoplasma switch device 1 can be implemented with low fabrication costs, and its performance surpasses that of today's ultra-high-speed electronic devices. A nanoplasma switch device using nanoplasma impulse formation, enabling the generation of ultrafast high power step, impulse, and terahertz signals which are key elements for ultra-fast electronics systems.

The invention claimed is:

1. A nanoplasma switch device, comprising:
   multiple electrically isolated electrodes;
   a gap separating the two electrodes;
   wherein the gap has a width which is dimensioned to effect the generation of a plasma by electric-field electron emission or tunneling;
   wherein the gap has a width of below 5 nanometers to reduce the nanoplasma switch device turn on voltage, for which a fast switching might happen through tunneling; and an optical device may be provided which is configured to trigger a discharge by an optical signal to control the switch device, by shining photons to one of the electrodes, which allows to stimulate electron emission or direct ionization by high energy.

2. The nanoplasma switch device according to claim 1, wherein the electrodes are formed of metal or doped semiconductor on a nonconductive substrate.

3. The nanoplasma switch device according to claim 1, wherein the gap has a width of 5 nm to 5 μm.

4. The nanoplasma switch device according to claim 1, wherein the gap is filled with air, particularly under atmospheric pressure.

5. The nanoplasma switch device according to claim 1, wherein the device operates at a given pressure below 900 hPa or above 1100 hPa.

6. The nanoplasma switch device according to claim 1, wherein the gap has a width of between 3 Angstrom and 5 nm to effect the generation of a plasma by tunneling.

7. The nanoplasma switch device according to claim 6, wherein between the electrodes a 2D material, such as tungsten selenide, molybdenum diselenide, and/or bornitride is introduced, wherein particularly the 2D material is provided as a lateral 2D material layer sandwiched between two electrodes in a vertical arrangement on a substrate.

8. The nanoplasma switch device according to claim 7, wherein the substrate is removed under the nanoplasma gap.

9. The nanoplasma switch device according to claim 1, wherein the gap width is configured to have an electrical field at a breakthrough voltage of between 10V and 1000V.

10. A circuitry for pulse-sharpening comprising:
    the nanoplasma switch device according to claim 1;
    signal driver circuit the output of which is connected with the nanoplasma switch device.

11. A circuitry for generating an oscillation comprising:
    the nanoplasma switch device according to claim 1;
    a resonator, coupled with the nanoplasma switch device;
    an energy source for energizing the resonator.

12. The circuitry according claim 11, further comprising an antenna element to radiate the high-frequency oscillation.

13. A circuitry for protecting an integrated circuit or a discrete device against overvoltage, comprising:
    a terminal of the integrated circuit or a discrete device;
    the nanoplasma switch device according to claim 1 connected with the terminal.

14. The circuitry according to claim 13, wherein the nanoplasma switch device is in series with a resistance.

* * * * *